(12) United States Patent
Suzuki et al.

(10) Patent No.: US 6,917,638 B2
(45) Date of Patent: Jul. 12, 2005

(54) HEAT RADIATOR FOR ELECTRONIC DEVICE AND METHOD OF MAKING IT

(75) Inventors: Katsunori Suzuki, Hamamatsu (JP); Kenzaburou Iijima, Hamamatsu (JP); Toshiharu Hoshi, Hamamatsu (JP)

(73) Assignee: Yamaha Corporation (JP)

( * ) Notice: Subject to any disclaimer, the term of this patent is extended or adjusted under 35 U.S.C. 154(b) by 92 days.

(21) Appl. No.: 09/978,934

(22) Filed: Oct. 16, 2001

(65) Prior Publication Data

US 2002/0043364 A1 Apr. 18, 2002

(30) Foreign Application Priority Data

Oct. 16, 2000 (JP) ........................................ 2000-314981

(51) Int. Cl.$^7$ ................................................ H01S 3/04
(52) U.S. Cl. ........................................ 372/36; 372/34
(58) Field of Search ..................................... 372/36, 34

(56) References Cited

U.S. PATENT DOCUMENTS

| | | | | |
|---|---|---|---|---|
| 5,661,902 A | * | 9/1997 | Katchmar | ..................... 29/840 |
| 6,546,030 B2 | * | 4/2003 | Sasao | ........................... 372/36 |
| 2002/0029875 A1 | * | 3/2002 | Takano | ....................... 165/185 |

FOREIGN PATENT DOCUMENTS

| JP | 03-231445 | 10/1991 |
|---|---|---|
| JP | 04-180534 | 6/1992 |
| JP | 04-215462 | 8/1992 |
| JP | 6-86996 | 12/1994 |
| JP | 06-334074 | 12/1994 |
| JP | 07-211818 | 8/1995 |
| JP | 09-107057 | 4/1997 |
| JP | 09-232485 | 9/1997 |
| JP | 10-173104 | 6/1998 |
| JP | 10-200208 | 7/1998 |
| JP | 2000-196269 | 7/2000 |
| JP | 2001-149765 | 6/2001 |
| WO | WO 00/13823 | 3/2000 |

OTHER PUBLICATIONS

Japanese Office Action dated Oct. 7, 2003 (with English translation).
"Laser Flash Thermal Horn Static Analyzer TC7000", Nippon Sinku Rikou Company, Japan.
"TMA6200", Seiko Instruments Co. Ltd., Published Mar. 1999.
Juan L. Sepulveda, et al, "Cooper/tungsten mounts keep diode lasers cool", Laser Focus World, May 2000 Edition.
Japanese Office Action dated Jun. 24, 2003 with translation of relevant portions.
Japanese Office Action issued Feb. 3, 2004 (with English translation).

* cited by examiner

*Primary Examiner*—Minsun Oh Harvey
*Assistant Examiner*—James Menefee
(74) *Attorney, Agent, or Firm*—Dickstein, Shapiro, Morin & Oshinsky, LLP.

(57) ABSTRACT

A heat radiator for dissipating heat from an electronic device, which is mounted on a board or which is installed in a casing, to the outside thereof is basically composed of a substrate having plenty of through holes, which are produced by press molding and sintering. The substrate having a low thermal expansion coefficient is made of a copper-tungsten alloy or a copper-molybdenum alloy in which the copper content is smaller than the tungsten content or molybdenum content. The through holes each having a circular shape or a rectangular shape are infiltrated with the compound having a high thermal conductivity and composed of a copper-tungsten alloy or a copper-molybdenum alloy in which the copper content is greater than the tungsten content or molybdenum content. Thus, the heat radiator allows thermal conduction along axial directions of the through holes while substantially avoiding unwanted thermal expansion thereof.

16 Claims, 9 Drawing Sheets

HEAT RADIATOR FOR ELECTRONIC DEVICE AND METHOD OF MAKING IT

BACKGROUND OF THE INVENTION

1. Field of the Invention

This invention relates to heat radiators (or heatsinks) that remove heat generated by electronic devices, which include semiconductor elements mounted on substrates (or boards) or installed in casings, by heat conduction or radiation. In addition, this invention also relates to methods of manufacturing the heat radiators for dissipating heat from the electronic devices to the outside. Further, this invention relates to semiconductor laser modules in which the heat radiators are attached to bottom walls of packages for providing semiconductor laser elements.

2. Description of the Related Art

Advances in recent technologies bring high power outputs and high integration of electronic devices such as semiconductor elements, which may correspond to thermoelectric elements, integrated circuits (ICs), large-scale integrated circuits (LSI), very-large-scale-integrated circuits (VLSI), and diodes, for example. There is also provided the tendency to rapidly increase amounts of heat generated by electronic devices. For this reason, semiconductor devices such as hybrid ICs made by high integration of circuit elements employ heat radiation systems (or heatsink systems) for efficiently dissipating heat of semiconductor elements to the outside. In practice, heat radiator boards (or heatsink boards) made of copper (Cu) or other metal materials having high melting points are integrally joined to ceramic circuit boards. In general, large differences in coefficients of thermal expansion exist between the heat radiator boards made of copper or other metal materials having high melting points and the semiconductor elements or between the heat radiator boards and the circuit boards. Due to thermal shocks that are repeatedly effected on the semiconductor devices because of the large differences of thermal expansion coefficients, thermal stresses are increased at joint interfaces between the heat radiator boards and semiconductor elements (or circuit boards), so that the heat radiating boards are easily separated therefrom.

Because of the aforementioned difficulty, it is necessary to develop heat radiator boards whose thermal expansion coefficients approximate those of the semiconductor elements or circuit boards for practical use. That is, the heat radiator boards are made from sintered bodies composed of tungsten (W) and other metal materials having high melting points. However, the heat radiator boards made of only the tungsten or other metal materials having high melting points may be insufficient in thermal conductivity. Hence, manufacturers have developed new heat radiator boards made of impregnated sintered alloys that are made by infiltrating (or impregnating) high thermal conductive materials such as copper (Cu) into vacancies (or cavities) in the sintered bodies made of only the tungsten or other metal materials having high melting points.

The aforementioned heat radiator boards made of impregnated sintered alloys are generally manufactured by the following steps.

(i) Powders of high melting point materials such as tungsten (W) are subjected to preliminary blending together with organic binders, so that a material mixture is produced and is subjected to metal mold pressing to form a thin board.

(ii) The formed thin board is subjected to degreasing and sintering to produce a porous sintered body including vacancies, into which high thermal conductive materials such as copper (Cu) are infiltrated (or impregnated).

(iii) Thereafter, the surface of the impregnated sintered body is subjected to surface processing using the milling machine (fraise) or lapping machine. Thus, it is possible to manufacture the heat radiator board.

In order to improve a thermal conductivity of the heat radiator board formed by the impregnated sintered body, it is necessary to increase the content of copper (Cu) which is superior in thermal conductivity. If such copper content is increased very much, the overall thermal expansion coefficient of the heat radiator board is increased. Under the influence of thermal shocks repeatedly caused, thermal stresses should be increased at joint interfaces between the heat radiator boards and the boards for mounting electronic devices or at joint interfaces between the heat radiator boards and the casings for installing electronic devices. This causes the heat radiator boards to easily peel off (or be removed) from the boards or casings.

In the heat radiator board made by the impregnated sintered body, copper materials are infiltrated (or impregnated) into vacancies that are formed inside of the sintered body. Hence, the thermal expansion occurs in such a manner that the thermal conduction progresses along prescribed portions at which the copper materials are impregnated. This indicates that the thermal conduction is made in random directions. Suppose that the heat radiation (or heat dissipation) occurs in random directions from the heat radiator board which is attached to the casing for installing electronic devices. In this case, it becomes difficult to promptly dissipate heat, generated by the electronic devices, to the outside of the casing. That is, there is a problem that the heat radiation efficiency (or heat dissipation efficiency) is deteriorated.

In addition, the heat radiation board made by the impregnated sintered body requires infiltration (or impregnation) of copper materials into vacancies of the sintered body. Therefore, it is necessary to perform the surface polishing process using the lapping machine at the last stage for manufacture of the heat radiator board. This causes complications in the manufacturing process of the heat radiator board, which is lead to an increase in the manufacturing cost. Further, organic binders are used to improve fluidity, mold ability, and shaping ability of material powders for use in formation of the sintered body. For this reason, it is necessary to perform a degreasing process. If the degreasing process is performed insufficiently below the required level, carbides easily adhere to the surface of the sintered body to fill its vacancies. This raises the difficulty in operating infiltration (or impregnation) of high thermal conductive materials.

Further, vacancies in the sintered body tend to contain non-infiltrated (or non-impregnated) portions of high thermal conductive materials, so that pinholes are easily formed on the surface of the sintered body. If a plating layer is formed on the surface of the sintered body having pinholes, plating blisters are easily formed. Therefore, it is difficult to produce a heat radiator board having a high quality realized by good plating. After infiltration (or impregnation) of high thermal conductive materials, a large amount of excess impregnated materials adheres to the surface of the sintered body. Therefore, it is necessary to perform the surface polishing process after the excess impregnated materials firmly adhering to the surface of the sintered body are removed by the polishing process and the like. This increases the number of finish processing steps in manufacture of the heat radiator board, which may lead to an increase in the manufacturing cost.

SUMMARY OF THE INVENTION

It is an object of the invention to provide a heat radiator in which heat radiation (or thermal conduction) is made in fixed directions and whose thermal expansion coefficient approximately equals to the heat expansion coefficient of the board for mounting electronic devices or the heat expansion coefficient of the casing for installing electronic devices.

This invention basically relates to heat radiators that are attached to boards for mounting electronic devices or casings for installing electronic devices, wherein the heat radiators dissipate heat generated by the electronic devices to the outside. This invention provides a special design and structure for the heat radiator in which through holes are formed over the substrate made by the prescribed material of the low thermal expansion coefficient and are filled with the material of the high thermal conductivity. This structure allows the heat conduction to progress along axial directions of the through holes, by which it is possible to rapidly dissipate heat from electronic devices mounted on the boards or installed in the casings. In addition, it is possible to reduce the heat expansion of the heat radiator because of the low thermal expansion coefficient of the substrate.

Specifically, the material having the low thermal expansion coefficient is selected from among the prescribed materials whose copper contents are relatively low and whose molybdenum content is relatively high, such as copper-tungsten alloys and copper-molybdenum alloys. Alternatively, it is selected from among other materials whose thermal expansion coefficients range between 4 ppm/K and 10 ppm/K or below, such as tungsten, iron-nickel alloys, and iron-nickel-cobalt alloys, wherein the thermal expansion coefficients are measured as the linear expansion coefficients under the condition where the temperature is increased from room temperature (RT) to 400° C. In addition, the material having the high thermal conductivity is selected from among the prescribed materials whose copper contents are relatively large and whose tungsten contents or molybdenum contents are relatively small, such as copper, copper-tungsten alloys, and copper-molybdenum alloys. The selected material having the high thermal conductivity is filled into the through holes of the substrate, which allows the thermal conduction to progress along axial directions of the through holes.

In general, the prescribed materials having low thermal expansion coefficients, such as the ceramics, are used to form the electronic devices as well as the boards for mounting electronic devices or casings for installing electronic devices. For this reason, it is necessary to approximate the thermal expansion coefficient of the heat radiator to the thermal expansion coefficient used for the electronic device, its board or casing. To satisfy such requirements, the substrate for use in the heat radiator is composed of the prescribed material, which is selected from among the aforementioned materials such as the copper-tungsten alloy, copper-molybdenum alloy, tungsten, iron-nickel alloy, and iron-nickel-cobalt alloy.

However, if the thermal expansion coefficient of the heat radiator is set close to the thermal expansion coefficient of the electronic device, its board or casing, the heat radiator should have degraded thermal conductivity. For this reason, this invention provides through holes over the surface of the substrate made of the prescribed alloy of the low thermal expansion coefficient, wherein the through holes are filled with the prescribed material of the high heat conductivity, which is selected from among the aforementioned materials such as the copper-tungsten alloy, copper-molybdenum alloy, and copper.

The horizontal shape (or cross-sectional shape) of the through hole can be adequately selected in response to the application of the heat radiator. In consideration of the manufacture ability of the heat radiator, it is preferable to employ a circular shape, elliptical shape, rectangular shape, and polygonal shape for the through holes. The arrangement of the through holes can be adequately selected in response to the application (or use) of the heat radiator. In consideration of the uniform heat radiation over the surface of the heat radiator, it is preferable to employ the unidirectional multicentric arrangement in which the holes are dispersed uniformly or irregularly in one thickness direction or one length direction, or unidirectional radial arrangement in which the holes are radially distributed in one thickness direction or one length direction.

As the total volume radio of the through holes occupied against the overall volume of the substrate becomes large, the thermal conductivity of the heat radiator is noticeably improved, and the thermal expansion coefficient is also increased. Therefore, it is preferable that the total volume ratio of the through holes is not increased above 45 vol. % against the overall volume of the substrate. On the other hand, as the total volume ratio of the through holes becomes small, the thermal expansion coefficient is improved, but the thermal conductivity is reduced. Therefore, it is also preferable that the total volume ratio of the through holes is not decreased below 10 vol. % against the overall volume of the substrate.

As the average diameter of the through holes becomes very small, the thermal expansion coefficient is improved, but the thermal conductivity is reduced. For this reason, it is preferable that the average diameter of the through holes is not decreased below 50 $\mu$m. On the other hand, as the average diameter of the through holes becomes very large, the thermal conductivity is improved, and the thermal expansion coefficient is increased as well. Hence, it is also preferable that the average diameter of the through holes is not increased above 1 mm.

The manufacturing method of the heat radiator of this invention is basically composed of five steps, as follows:

(i) First step wherein the tungsten powder (or molybdenum powder), copper powder and binders are mixed together in accordance with the first mixing ratio in which the tungsten content (or molybdenum content) is higher than the copper content; then, the mixed powder is subjected to kneading to produce a first molding compound.

(ii) Second step wherein the first molding compound is filled into the mold to form a base molding providing plenty of through holes having the prescribed shape and arrangement.

(iii) Third step wherein the tungsten powder (or molybdenum powder), copper powder and binders are mixed together in response to the second mixing ratio in which the copper content is higher than the tungsten content (or molybdenum content); then, the mixed powder is subjected to kneading to produce a second molding compound.

(iv) Fourth step wherein through holes of the base molding are filled with the second molding compound to form an integral molding.

(v) Fifth step wherein the integral molding is subjected to sintering to produce a composite sintered body.

Through the aforementioned steps, it is possible to produce a substrate having through holes which is basically composed of the material of the low thermal expansion coefficient such as the copper-tungsten alloy or copper-molybdenum alloy in which the copper content is relatively small while the tungsten content or molybdenum content is relatively large. In addition, it is also possible to produce the material of the high thermal conductivity such as the copper-tungsten alloy or copper-molybdenum alloy in which the copper content is relatively large while the tungsten content or molybdenum content is relatively small. Therefore, it is possible to easily manufacture the heat radiator from the composite sintered body, which is produced by sintering the substrate whose through holes are filled with the material of the high thermal conductivity.

The other manufacturing method of the heat radiator of this invention is basically composed of three steps, as follows:

(i) First step wherein through holes having the prescribed shape and arrangement are formed over the surface of a substrate, which is composed of the prescribed metal material or alloy such as tungsten, iron-nickel alloy, and iron-nickel-cobalt alloy whose thermal expansion coefficients are not larger than the prescribed range between 4 ppm/K and 10 ppm/K. Herein, the thermal expansion coefficients are measured as linear expansion coefficients under the condition where the temperature is increased from room temperature to 400° C.

(ii) Second step wherein a copper plate is laminated together with the substrate having the through holes to form a laminated body.

(iii) Third step wherein the laminated body is subjected to a heating process; therefore, the copper plate is melted so that copper material is infiltrated into the through holes of the substrate.

Through the aforementioned steps, it is possible to produce the substrate which is made of the material of the low thermal expansion coefficient (not greater than the prescribed range between 4 ppm/K and 10 ppm/K) such as tungsten, iron-nickel alloy, and iron-nickel-cobalt alloy, wherein the through holes of the substrate are filled with the material of the high thermal conductivity composed of copper. Therefore, it is possible to easily manufacture the heat radiator from the aforementioned substrate whose through holes are filled with the copper material.

The heat radiator of this invention can be applied to a variety of electronic devices, particularly the semiconductor laser module having the semiconductor laser element for emitting laser beams. The semiconductor laser module provides the thermoelectric module as the cooling component. That is, the thermoelectric module is composed of a plurality of thermoelectric elements (made of semiconductors), which are electrically connected together by conduction between a pair of electrodes formed at surfaces of insulating substrates, which are arranged opposite to each other. In the aforementioned semiconductor laser module, the heat absorption side of the thermoelectric module is jointed with the board for mounting the semiconductor laser element, and the heat radiator is attached to the bottom wall of the package storing the semiconductor laser element in contact with the heat radiation side of the thermoelectric module.

BRIEF DESCRIPTION OF THE DRAWINGS

These and other objects, aspects, and embodiments of the present invention will be described in more detail with reference to the following drawing figures, in which.

DESCRIPTION OF THE PREFERRED EMBODIMENTS

This invention will be described in further detail by way of examples with reference to the accompanying drawings.

1. Examples of Manufacture of Heat Radiators

Figure 1A:
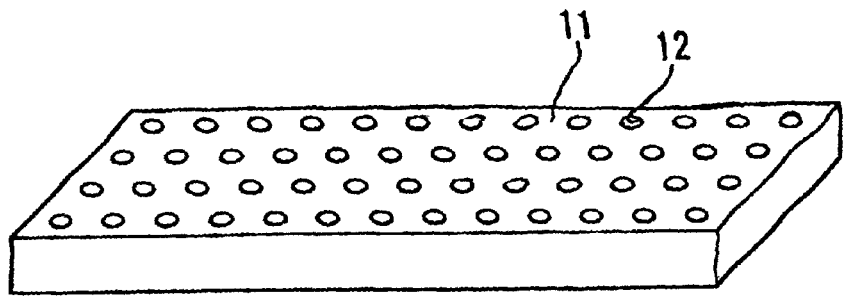
FIG. 1A is a perspective view diagrammatically showing a first step of manufacture of a heat radiator in accordance with a first embodiment of the invention.
Figure 1B:
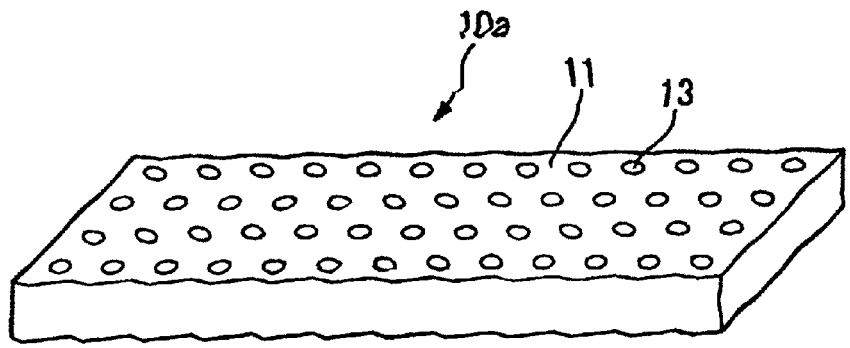
FIG. 1B is a perspective view diagrammatically showing a second step of manufacture of the heat radiator.
Figure 1C:
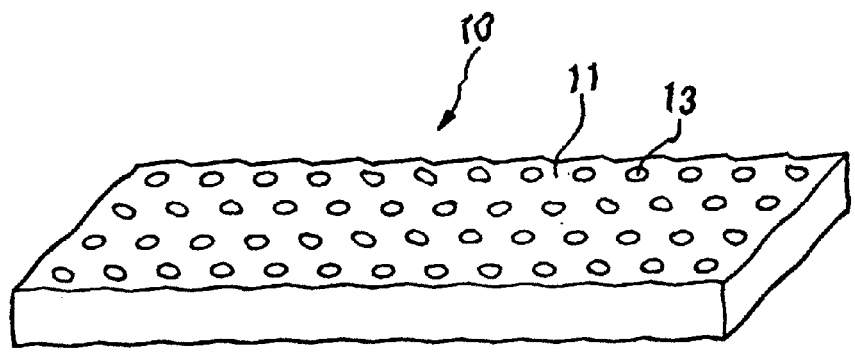
FIG. 1C is a perspective view diagrammatically showing a composite sintered body that is produced through the first and second steps of manufacture.
Figure 1D:
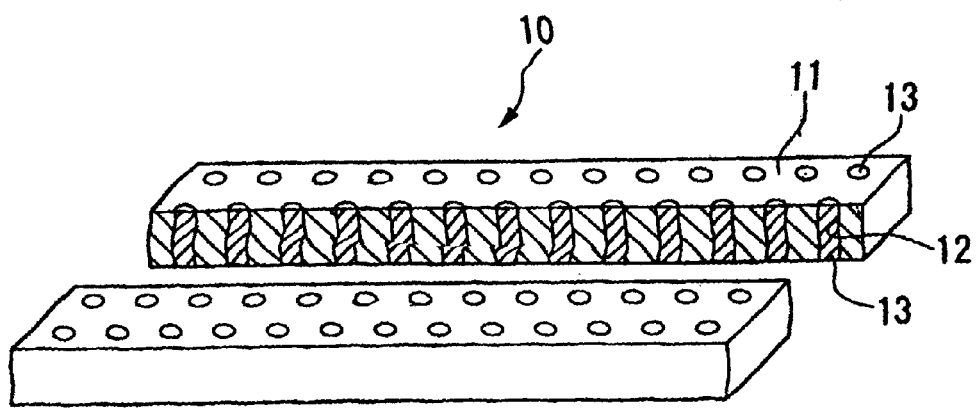
FIG. 1D is a perspective view showing the composite sintered body that is cut into pieces.

Descriptions will be given with respect to examples of manufacture of heat radiators with reference to FIGS. 1A to 1D, which diagrammatically show manufacturing steps for the heat radiator in accordance with the first embodiment of the invention. Specifically, FIG. 1A shows a first step of manufacture, and FIG. 1B shows a second step of manufacture. Through these steps, it is possible to produce a composite sintered body for use in manufacture of the heat radiator of this invention. FIG. 1C shows an example of the composite sintered body, which is cut into pieces as shown in FIG. 1D.

First, there are provided tungsten (W) powder containing tungsten grains having an average grain diameter of about 2 μm and copper (Cu) powder containing copper grains having an average grain diameter of about 2 μm. These powders are mixed together to produce a mixed metal powder in which the tungsten powder occupies 80 volume percent (or 80 vol. %) and the copper powder occupies 20 volume percent (or 20 vol. %). Then, the mixed metal power is further mixed together with the same volume of binders, which are made by mixtures of acrylic resin and wax, for example. Further, organic solvents are added to the mixture of the mixed metal powder and binders, which are then subjected to kneading to produce 'tungsten-rich' molding compound composed of Cu—W. Thereafter, the molding compound is subjected to pelletization.

Pellets of the tungsten-rich molding compound composed of Cu—W are filled into the hopper of the injection molding machine (not shown). Therefore, the pellets of the molding compound are subjected to injection molding using a metal mold whose temperature is set at 40° C. at an injection temperature of 130° C. The metal mold is then subjected to water cooling to solidify injected substances. Thus, it is possible to produce a base molding (or green body) 11 in which plenty of through holes 12 are uniformly arranged as shown in FIG. 1A. The base molding 11 has a board-like shape having prescribed dimensions in which the thickness is about 2 mm, the length is about 30 mm, and the width is about 20 mm, for example. In addition, the diameter of the through hole 12 is about 0.5 mm. Further, the total volume of the through holes 12 occupied in the overall volume of the base molding 11 is about 30 vol. %, for example.

Next, there are provided tungsten (W) powder containing tungsten grains having an average grain diameter of about 2 μm and copper (Cu) powder containing copper grains having an average grain diameter of about 2 μm. These powders are mixed together to produce a mixed metal powder in which the tungsten powder occupies 25 vol. %, and the copper powder occupies 75 vol. %. The mixed metal power is further mixed together with the same volume of binders (which are made of mixtures of acrylic resin and wax, for example) and is then subjected to kneading to produce a 'copper-rich' molding compound composed of Cu—W. The molding compound is then subjected to pelletization.

Pellets of the copper-rich molding compound are filled into the hopper of an injection molding machine (not shown). In addition, the aforementioned base molding 11 is installed in the metal mold of the injection molding machine. Then, injection molding is performed at an injection temperature of 130° C. by using the metal mold whose temperature is set at 40° C. Thereafter, the metal mold is subjected to water cooling to solidify injected substances. Thus, it is possible to produce a substrate 10a in which the through holes 12 of the base molding 11 are filled with the copper-rich molding compound composed of Cu—W as shown in FIG. 1B.

The substrate 10a is arranged in the sintering furnace (not shown), which is charged with nitrogen gas at a flow velocity of 1 l/min. After establishing the atmosphere of nitrogen gas within the sintering furnace, the sintering furnace is heated at the prescribed temperature increase speed of 0.5° C./min from room temperature (RT) to a prescribed high temperature of 410° C. That is, a binder removal process is performed by burning binders contained in the substrate 10a. Thereafter, the sintering furnace is filled with hydrogen gas at the prescribed flow velocity of 1 l/min to establish a reducing atmosphere therein. Then, the sintering furnace is heated at the prescribed temperature increase speed of 5° C./min up to a very high temperature of 1450° C. Thus, the substrate 10a is subjected to sintering by maintaining the very high temperature in the sintering furnace, thus producing a composite sintered body 10 shown in FIG. 1C.

In the aforementioned composite sintered body 10, 'copper-rich' and 'high thermal conductive' filler layers 13 composed of Cu—W are formed along axial directions of the through holes 12 of the 'tungsten-rich' base molding 11 having the low thermal expansion coefficient composed of Cu—W as shown in FIG. 1D.

2. Measurement of Thermal Characteristics

Figure 2:
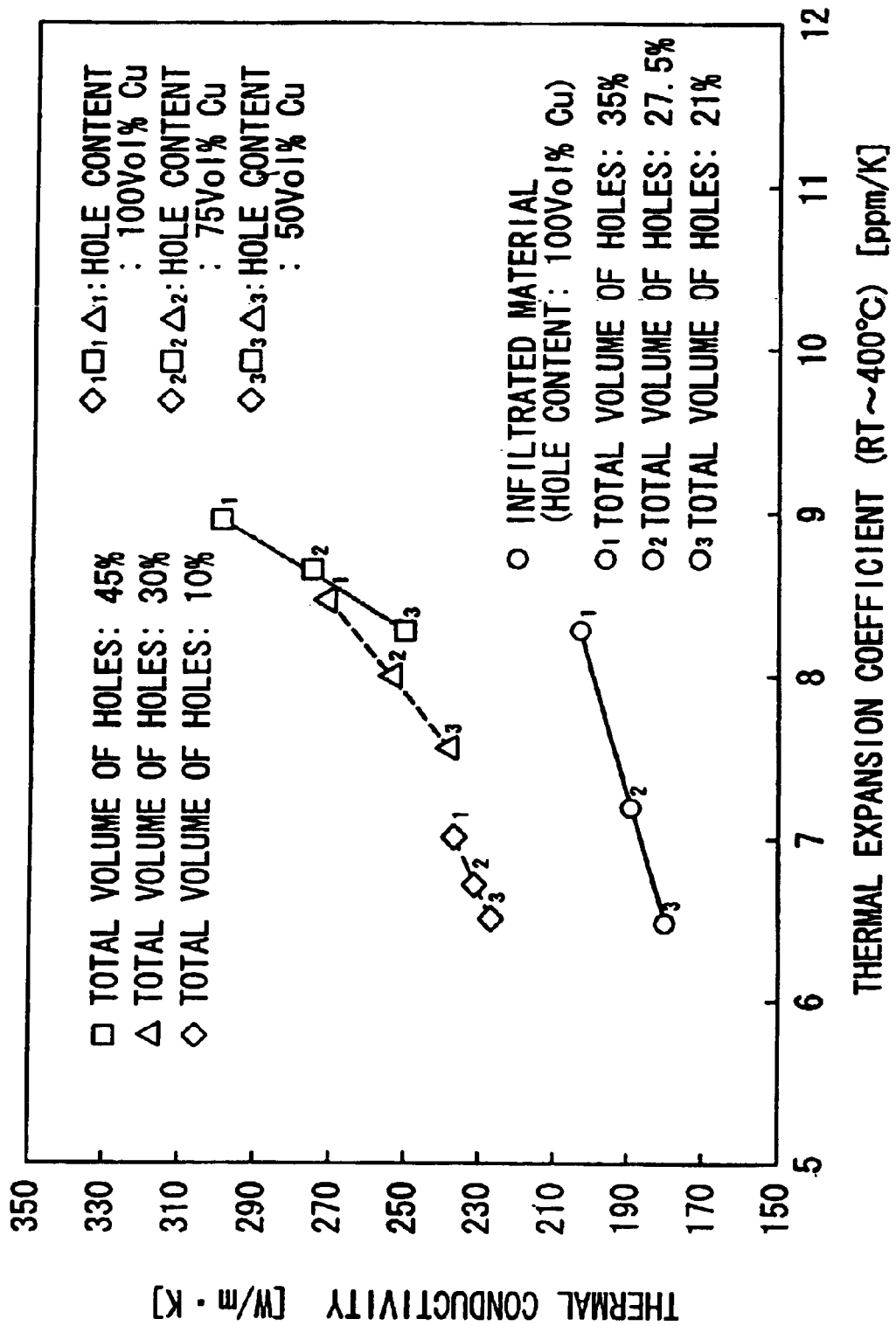
FIG. 2 is a graph showing relationships between the thermal conductivity and thermal expansion coefficient that are measured with respect to examples of the composite sintered body having a copper content of 20 vol. % and through holes of a diameter of 0.5 mm by changing the total volume ratio of through holes of the base molding.

Next, descriptions will be given with respect to results of the measurement effected on the aforementioned composite sintered body 10. Specifically, the thermal conductivity and thermal expansion coefficient are measured with respect to examples of the composite sintered body 10, wherein the diameter of the through hole 12 of the base molding 11 is about 0.5 mm, the total volume ratio of the through holes 12 within the base molding 11 is about 30 vol. %, the volume ratio of tungsten is about 80 vol. %, and the volume ratio of copper within the filler layers 13 is about 75 vol. %. In addition, the measurements are performed using a laser flash apparatus, which is entitled "Laser Flash Thermal Horn Stack Analyzer TC7000" manufactured by Nippon Sinku Rikou Company, and the thermal expansion measurement apparatus entitled "TMA6200" manufactured by Seiko Co. Ltd. Measurement results indicate that the thermal conductivity is 255 W/mk, and the thermal expansion coefficient is 8 ppm/K, which is measured as the linear expansion coefficient caused by the temperature increase from room temperature to 400° C. These values are plotted at a point designated by a symbol '$\Delta_2$' on the graph shown in FIG. 2.

Next, examples of the composite sintered body 10 are produced by using examples of the molding compound composed of Cu—W in which the copper ratio of the filler layers 13 is adjusted to 100 vol. % and 50 vol. % respectively. Then, the thermal conductivity and thermal expansion coefficient are measured with respect to each of the aforementioned examples of the composite sintered body 10. Measurement results are respectively plotted at points '$\Delta_1$' and '$\Delta_3$' on the graph of FIG. 2.

Examples of the composite sintered body 10 are produced by using examples of the base molding 11 in which the diameter of the through hole 12 is about 0.5 mm, and the volume ratio of tungsten is about 80 vol. %, wherein the total volume ratio of the through holes 12 is set to 45 vol. %, and the volume ratio of copper is set to 100 vol. %, 75 vol. %, and 50 vol. % respectively. Then, the thermal conductivity and thermal expansion coefficient are measured with respect to each of the aforementioned examples of the sintered body 10. Measurement results are respectively plotted at points '$\square_1$', '$\square_2$', and '$\square_3$' on the graph of FIG. 2.

Examples of the composite sintered body 10 are produced by using examples of the base molding 11 in which the diameter of the through hole 12 is about 0.5 mm, and the volume ratio of tungsten is about 80 vol. %, wherein the total volume ratio of the through holes 12 is about 10 vol. %, and the volume ratio of copper within the filler layers 13 is set to 100 vol. %, 75 vol. %, and 50 vol. % respectively. Then, the thermal conductivity and thermal expansion coefficient are measured with respect to the aforementioned examples of the composite sintered body 10. Measurement results are plotted at points '$\diamond_1$', '$\diamond_2$', and '$\diamond_3$' on the graph of FIG. 2.

Other examples of the sintered body (or infiltrated material) are produced for the comparison with the aforementioned examples. That is, the tungsten power is compressed and is then subjected to temporary sintering to produce a 'porous' temporary sintered body, on which copper plate is laminated and is then subjected to the heating process. Thus, the 'comparative' sintered body is produced by infiltrating copper materials into vacancies of the temporary sintered body. Actually, different examples of the comparative sintered body are produced by changing the total vacancy ratio within the temporary sintered body, which is set to 35 vol. %, 27.5 vol. %, and 21 vol. %, respectively. Then, the thermal conductivity and thermal expansion coefficient are measured with respect to each of the aforementioned examples of the comparative sintered body. Measurement results are respectively plotted at points '$O_1$' (vacancy ratio of 35 vol. %), '$O_2$' (vacancy ratio of 27.5 vol. %), and '$O_3$' (vacancy ratio of 21 vol. %) on the graph of FIG. 2.

Next, examples of the composite sintered body 10 are produced by using examples of the base molding 11 in which the volume ratio of tungsten is about 80 vol. %, and the total volume ratio of the through holes 12 is about 30 vol. %, wherein diameters of the through holes 12 are set to 0.05 mm, 0.5 mm, and 1.0 mm, respectively, while the volume ratio of copper within the filler layers 13 are also set to 100 vol. %, 75 vol. %, and 50 vol. %, respectively. Then, the thermal conductivity and thermal expansion coefficient are measured with respect to each of the aforementioned examples of the composite sintered body 10. With respect to the examples of the composite sintered body 10 in which the diameter of the through holes 12 is 0.05 mm, measurement results are respectively plotted at points '$\diamond_1$' (copper content of 100 vol. %), '$\diamond_2$' (copper content of 75 vol. %), and '$\diamond_3$' (copper content of 50 vol. %) on the graph of FIG. 3.

Figure 3:
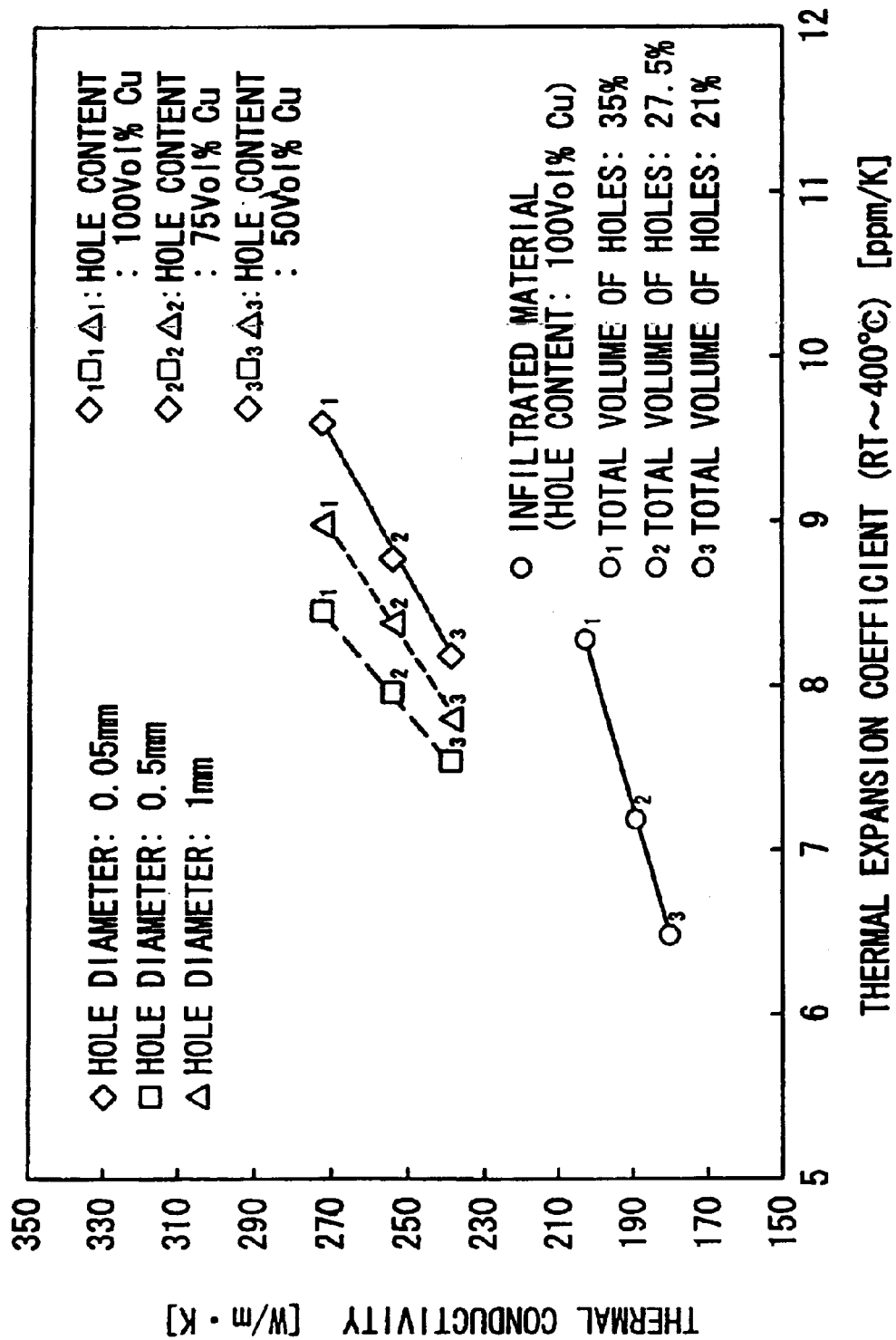
FIG. 3 is a graph showing relationships between the thermal conductivity and thermal expansion coefficient that are measured with respect to examples of the composite sintered body having a copper content of 20 vol. % and a total volume ratio of through holes of 30 vol. % by changing the diameter of through holes of the base molding.

With respect to the examples of the composite sintered body 10 in which the diameter of the through holes 12 is 0.5 mm, measurement results are respectively plotted at points '$\square_1$' (copper content of 100 vol. %), '$\square_2$' (copper content of 75 vol. %), and '$\square_3$' (copper content of 50 vol. %) on the graph of FIG. 3. With respect to the examples of the composite sintered body 10 in which the diameter of the through holes 12 is 1.0 mm, measurement results are respectively plotted at points '$\Delta_1$' (copper content of 100 vol. %), '$\Delta_2$' (copper content of 75 vol. %), and '$\Delta_3$' (copper content of 50 vol. %) on the graph of FIG. 3. Similar to the foregoing graph of FIG. 2, the graph of FIG. 3 also shows the measurement results for the examples of the infiltrated material, which are respectively plotted at points '$O_1$' (vacancy ratio of 35 vol. %), '$O_2$' (vacancy ratio of 27.5 vol. %), and '$O_3$' (vacancy ratio of 21 vol. %).

Next, examples of the composite sintered body 10 are produced by using examples of the base molding 11 in which the volume ratio of tungsten is about 80 vol. %, and the total volume ratio of the through holes 12 is about 45 vol. %, wherein the diameters of the through holes 12 are set to 0.05 mm, 0.5 mm, and 1.0 mm, respectively, and the volume ratios of copper within the filler layers 13 are set to 100 vol. %, 75 vol. %, and 50 vol. %, respectively. The thermal conductivity and thermal expansion coefficient are measured with respect to each of the aforementioned examples of the composite sintered body 10. With respect to the examples of the composite sintered body 10 in which the diameter of the through holes 12 is 0.05 mm, measurement results are respectively plotted at points '$\diamond_1$' (copper content of 100 vol. %), '$\diamond_2$' (copper content of 75 vol. %), and '$\diamond_3$' (copper content of 50 vol. %) on the graph shown in FIG. 4.

Figure 4:
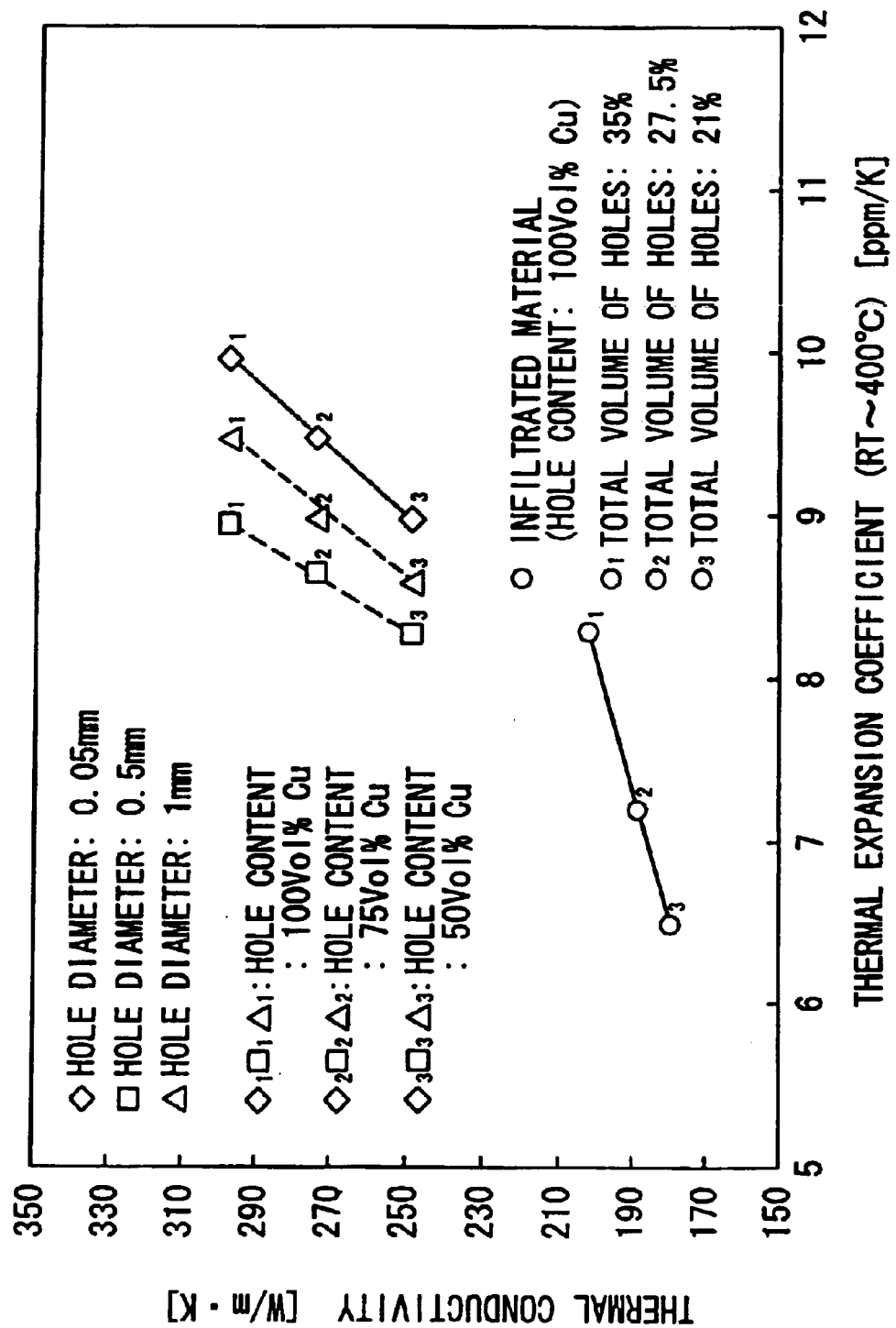
FIG. 4 is a graph showing relationships between the thermal conductivity and thermal expansion coefficient that are measured with respect to examples of the composite sintered body having a copper content of 20 vol. % and a total volume ratio of through holes of 45 vol. % by changing the diameter of through holes of the base molding.

With respect to the examples of the composite sintered body 10 in which the diameter of the through holes 12 is 0.5 mm, measurement results are respectively plotted at points '$\square_1$' (copper content of 100 vol. %), '$\square_2$' (copper content of 75 vol. %), and '$\square_3$' (copper content of 50 vol. %) on the graph of FIG. 4. With respect to the examples of the composite sintered body 10 in which the diameter of the through holes 12 is 1.0 mm, measurement results are respectively plotted at points '$\Delta_1$' (copper content of 100 vol. %), '$\Delta_2$' (copper content of 75 vol. %), and '$\Delta_3$' (copper content of 50 vol. %) on the graph shown in FIG. 4. Similar to the foregoing graph of FIG. 2, the graph of FIG. 4 also shows the measurement results for the examples of the infiltrated material, which are respectively plotted at points '$O_1$' (vacancy ratio of 35 vol. %), '$O_2$' (vacancy ratio of 27.5 vol. %), and '$O_3$' (vacancy ratio of 21 vol. %).

Examples of the composite sintered body 10 are produced by using examples of the base molding 11 in which the volume ratio of tungsten is about 80 vol. %, and the total volume ratio of the through holes 12 is about 10 vol. %, wherein the diameters of the through holes 12 are set to 0.05 mm, 0.5 mm, and 1.0 mm, respectively, and the volume ratios of copper within the filler layers 13 are set to 100 vol. %, 75 vol. %, and 50 vol. %, respectively. The thermal conductivity and thermal expansion coefficient are measured with respect to each of the aforementioned examples of the composite sintered body 10. With respect to the examples of the composite sintered body 10 in which the diameter of the through holes 12 is 0.05 mm, measurement results are respectively plotted at points '$\diamond_1$' (copper content of 100 vol. %), '$\diamond_2$' (copper content of 75 vol. %), and '$\diamond_3$' (copper content of 50 vol. %) on the graph shown in FIG. 5.

Figure 5:
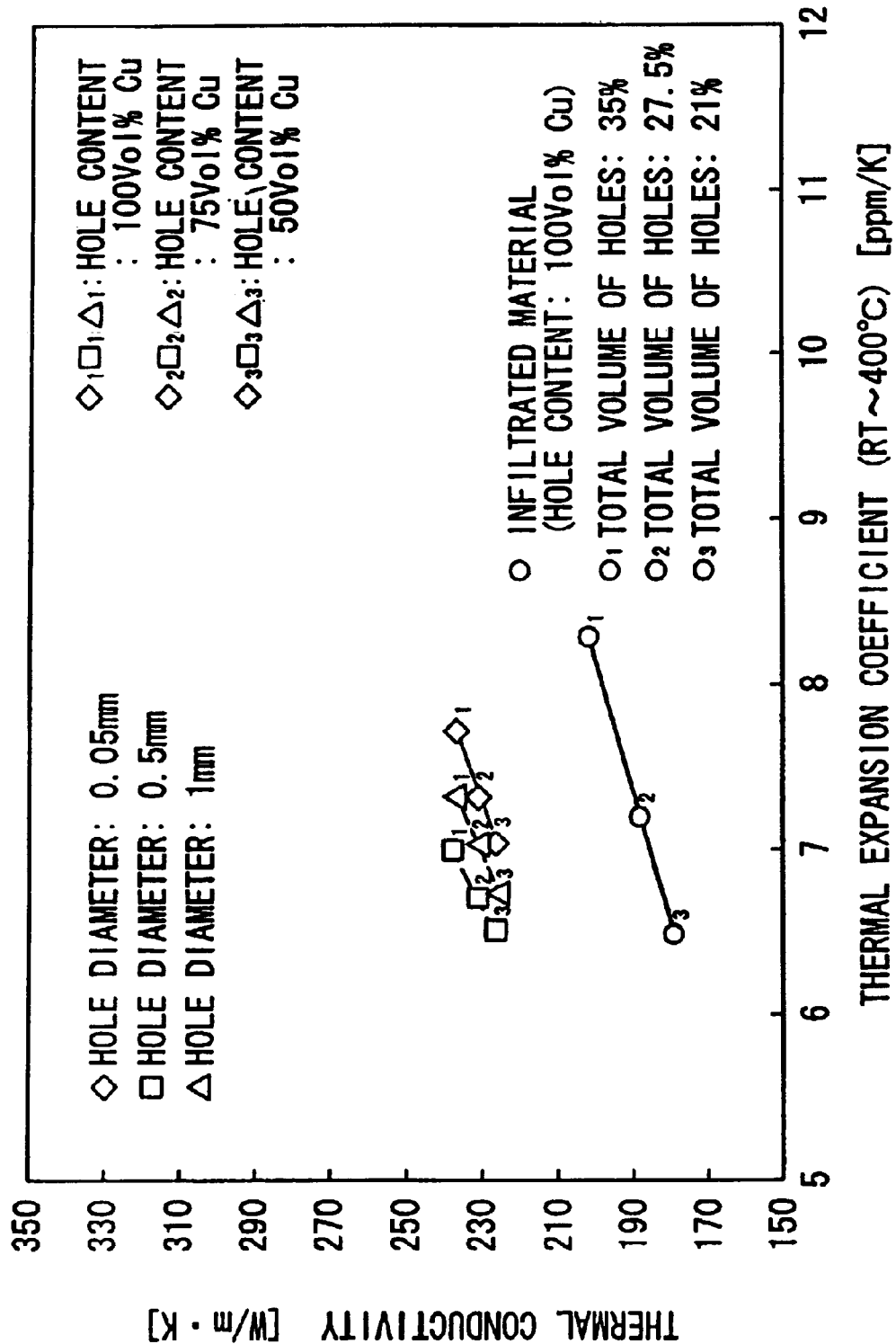
FIG. 5 is a graph showing relationships between the thermal conductivity and thermal expansion coefficient that are measured with respect to examples of the composite sintered body having a copper content of 20 vol. % and a total volume ratio of through holes of 10 vol. % by changing the diameter of through holes within the base molding.

With respect to the examples of the composite sintered body 10 in which the diameter of the through holes 12 is 0.5 mm, measurement results are respectively plotted at points '$\square_1$' (copper content of 100 vol. %), '$\square_2$' (copper content of 75 vol. %), and '$\square_3$' (copper content of 50 vol. %) on the graph of FIG. 5. With respect to the examples of the composite sintered body 10 in which the diameter of the through holes 12 is 1.0 mm, measurement results are respectively plotted at points '$\Delta_1$' (copper content of 100 vol. %), '$\Delta_2$' (copper content of 75 vol. %), and '$\Delta_3$' (copper content of 50 vol. %) on the graph shown in FIG. 5. Similar to the foregoing graph of FIG. 2, the graph of FIG. 5 also shows the measurement results for the examples of the infiltrated material, which are respectively plotted at points '$O_1$' (vacancy ratio of 35 vol. %), '$O_1$' (vacancy ratio of 27.5 vol. %), and '$O_3$' (vacancy ratio of 21 vol. %).

It can be clearly understood from the measurement results shown in FIGS. 2 to 5 that as compared with the sintered body which is produced by infiltrating copper materials into vacancies of the temporary sintered body, the composite sintered body 10 which is produced through the sintering by filling the through holes of the tungsten-rich base molding composed of Cu—W with the copper-rich filler materials composed of Cu—W are improved in the thermal conductivity, particularly with respect to the prescribed range of the thermal expansion coefficients appropriately for ceramics and glasses. The improvement in the thermal conductivity can be clearly observed within the prescribed range of thermal expansion coefficients ranging between 4 ppm/K and 10 ppm/K, which are measured within the prescribed range of temperatures ranging from room temperature (RT) to 400° C. For this reason, it may be required to restrict the total volume of the through holes in the base molding, which corresponds to the total filler volume of the copper-rich filler materials composed of Cu—W, to the prescribed range between 10 vol. % and 45 vol. %. Strictly speaking, it is preferable to restrict it to a narrower range between 20 vol. % and 45 vol. %. In addition, it may be required to restrict the diameters of the through holes of the base molding to the prescribed range between 0.05 mm (i.e., 50 μm) and 1.00 mm. Strictly speaking, it is preferable to restrict it to a narrower range between 0.1 mm and 1.00 mm.

3. Measurement of Heat Radiation Characteristics

Figure 6:
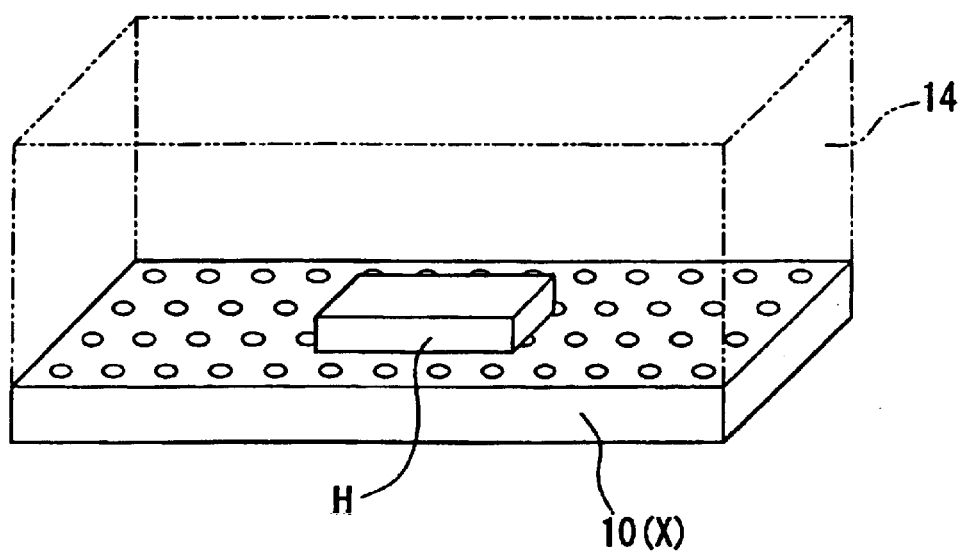
FIG. 6 is a perspective view diagrammatically showing a layout for performing experiments on the composite sintered body and infiltrated material respectively.

Next, descriptions will be given with respect to results of the measurement that is effected with respect to heat radiation characteristics (or heat dissipation characteristics). Specifically, we the inventors have performed various experiments for measuring the rate of heat radiation (or heat dissipation) by the heat radiator or heatsink (or temperature increase rate of the heater) by using the aforementioned composite sintered body 10 and an infiltrated material X whose thermal expansion coefficient is equal to that of the composite sintered body 10. FIG. 6 shows a layout for performing experiments on the composite sintered body 10 and the infiltrated material X. Herein, a heater (or an electric heater) H is mounted on the surface of the heat radiator, which corresponds to the composite sintered body 10 or the infiltrated material X. The heater H and the heat radiator are enclosed within a heat insulator 14. The experiments are performed such that the heater H is electrically energized to cause electric currents flowing through heating wires thereof, and the temperature of the heater H is measured. The experiments produce measurement results, which are plotted on the graph shown in FIG. 7, wherein the horizontal axis represents the electric power consumption (Watts) of the heater while the vertical axis represents the temperature (° C.) of the heater H. Measurements results for the composite sintered body 10 are plotted by symbols 'Δ', while measurement results for the infiltrated material X are plotted by symbols '○'.

Figure 7:
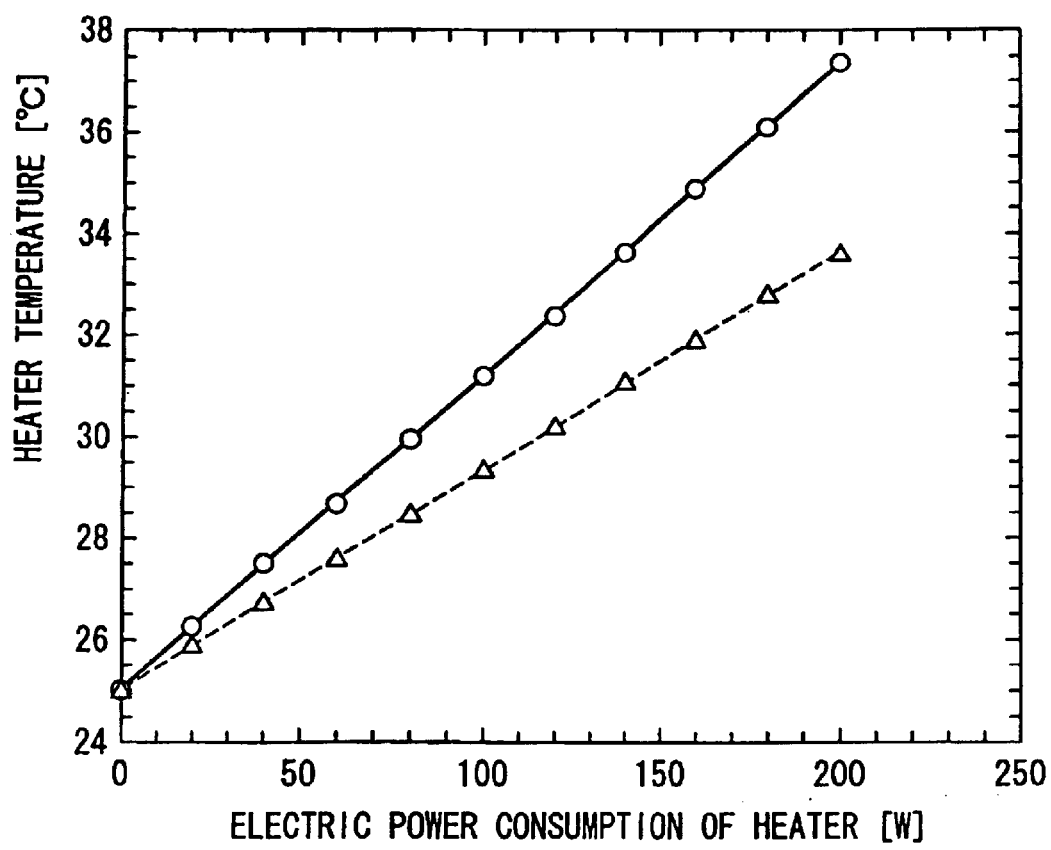
FIG. 7 is a graph showing relationships between the heater temperature and electric power consumption with respect to the composite sintered body and infiltrated material respectively.

The graph of FIG. 7 clearly shows that the heater H provides small temperature increases due to heat radiation effects (or heat dissipation effects) of the composite sintered body 10 as compared with the infiltrated material X. This indicates that the composite sintered body 10 is more superior in heat radiation efficiency and rate (or heat dissipation efficiency and rate) than the infiltrated material X.

Concretely speaking, the aforementioned experiments use an example of the composite sintered body 10 having prescribed measurements, wherein the diameter of the through holes 12 of the base molding 11 is 0.5 mm; the total volume ratio of the through holes 12 is 30 vol. %; the volume ratio of tungsten is 80 vol. %; the volume ratio of copper within the filler layers 13 is 75 vol. %; the thermal conductivity is 255 W/mK; the thermal expansion coefficient is 8.0 ppm/K; and the thermal resistance is −0.061728 K/W. In addition, the experiments also use an example of the infiltrated material X having prescribed measurements, wherein the thermal conductivity is 180 W/mK; the thermal expansion coefficient is 8.0 ppm/K; and the thermal resistance is 0.043573 K/W. Both the composite sintered body 10 and the infiltrated material X have the same dimensions, wherein the thickness is 10 mm; the length is 30 mm; and the width is 30 mm.

4. Other Examples of Heat Radiators

Next, descriptions will be given with respect to other examples of heat radiators in accordance with a second embodiment of the invention. The foregoing examples of the heat radiators of the first embodiment (see FIGS. 1A to 1D) are manufactured basically by the three steps, as follows:
(i) The base molding having through holes is formed by the so-called HIM method (i.e., metal powder injection molding method).
(ii) The through holes are filled with filler materials.
(iii) The base molding whose through holes are filled with the filler materials are subjected to sintering, thus producing the composite sintered body.

Figure 8A:
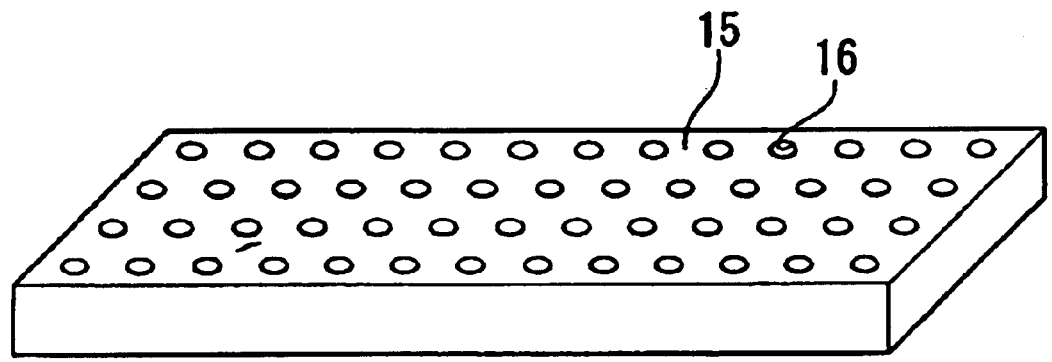
FIG. 8A is a perspective view diagrammatically showing a first step for the manufacture of the heat radiator in accordance with a second embodiment of the invention.
Figure 8B:
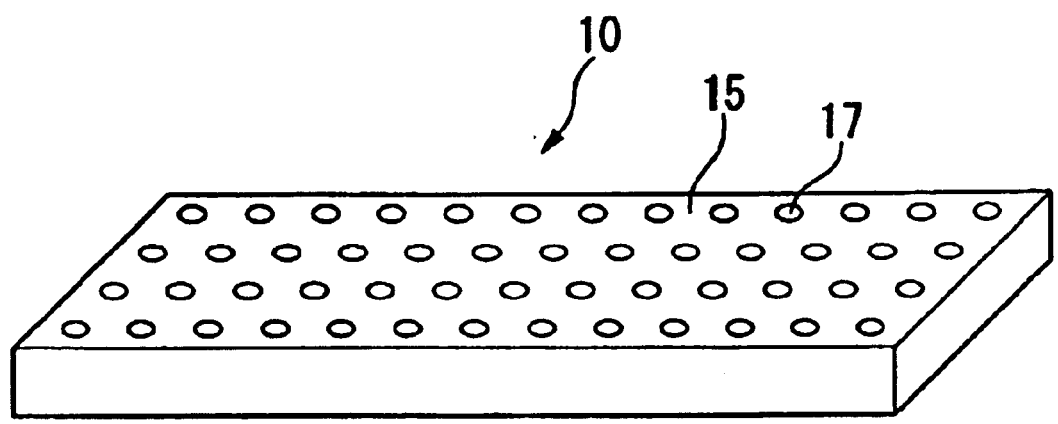
FIG. 8B is a perspective view diagrammatically showing a second step for the manufacture of the heat radiator.

In contrast to the foregoing examples of the heat radiators, the heat radiators of the second embodiment are produced by the other manufacturing method, details of which will be described with reference to FIGS. 8A and 8B. Specifically, FIG. 8A shows a first step in the manufacture of the heat radiator, and FIG. 8B shows a second step in the manufacture of the heat radiator.

First, there is provided a tungsten board 15 having prescribed dimensions, wherein the thickness is 2 mm; the length is 30 mm; and the width is 20 mm. In addition, an electric discharge process is effected to form through holes 16 having the same diameter of 0.5 mm, which are uniformly dispersed with respect to the overall surface area of the tungsten board 15. Incidentally, the total volume ratio of the through holes 16 occupied against the total volume of the tungsten board 15 is adjusted to be about 30 vol. %. A copper plate is mounted on the tungsten board 15 having the through holes 16 to form a laminated body. Then, the laminated body is placed inside of the heating furnace (not shown), which is filled with hydrogen gas at the flow velocity of 1 l/min to establish the reducing atmosphere. Thereafter, the laminated body is heated at the temperature increase rate of 5° C./min up to the prescribed high temperature of 1150° C., which is maintained for thirty minutes. Thus, copper materials 17 are infiltrated into the through holes 16 of the tungsten board 15 respectively. Through the aforementioned steps, it is possible to produce a composite metal body 10, which is shown in FIG. 8B.

Similarly to the foregoing first embodiment, the thermal conductivity and thermal expansion coefficient are measured by using the laser flash apparatus entitled "Laser Flash Thermal Horn Static Analyzer TC7000" manufactured by Nippon Sinku Rikou Company, and the thermal expansion measurement apparatus entitled "TMA6200" manufactured by Seiko Co., Ltd. Measurement results show that the thermal conductivity is 255 W/mK, and the thermal expansion coefficient is 6.9 ppm/K, which is measured as the linear expansion coefficient under the condition where the temperature is increased from room temperature to 400° C.

5. Modified Examples of Heat Radiators

Figure 9A:
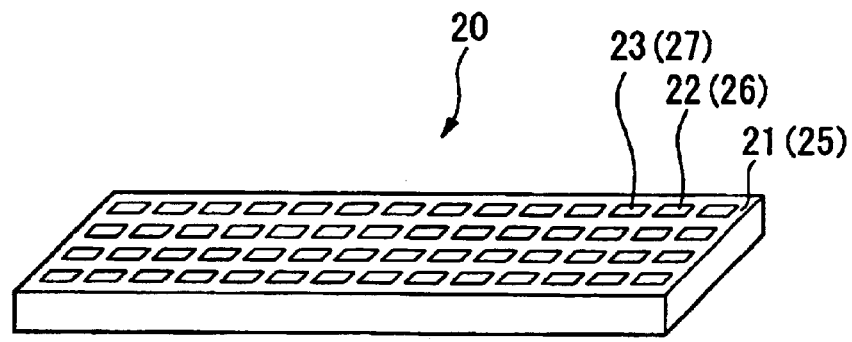
FIG. 9A is a perspective view diagrammatically showing a first modified example of the heat radiator that employs 'rectangular' through holes instead of 'circular' through holes.
Figure 9B:
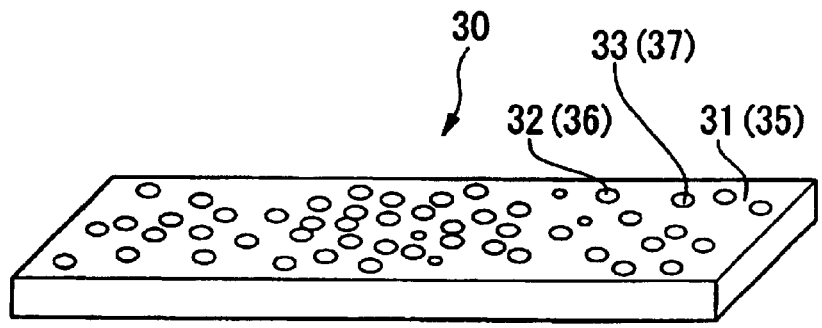
FIG. 9B is a perspective view diagrammatically showing a second modified example of the heat radiator in which through holes are subjected to irregular arrangement.
Figure 9C:
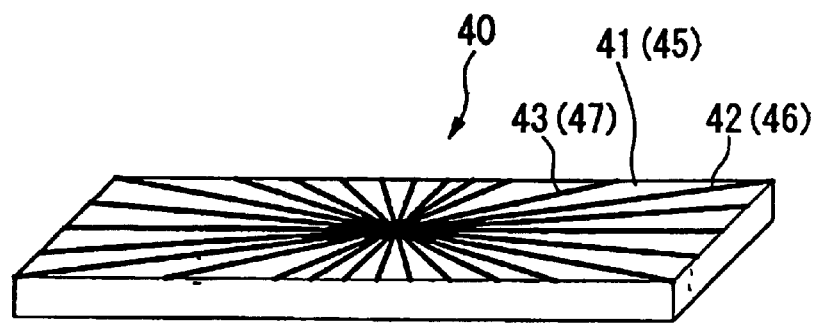
FIG. 9C is a perspective view diagrammatically showing a third modified example of the heat radiator that employs radial formation of through holes.

The aforementioned embodiments are designed such that each through hole has a circular shape in plan view, and such 'circular' through holes are uniformly dispersed over the entire surface area of the heat radiator. Of course, it is possible to modify them with respect to the horizontal shape of the through hole and the arrangement of the through holes over the surface area of the heat radiator. FIGS. 9A to 9C show modified examples of heat radiators employing different shapes of through holes and different arrangements of through holes. Specifically, FIG. 9A shows a first modified example of the heat radiator in which the horizontal shape of through holes is modified; FIG. 9B shows a second modified example of the heat radiator in which the arrangement of through holes is modified; and FIG. 9C shows a third modified example of the heat radiator in which the horizontal shape and arrangement of through holes are both modified.

(1) First Modified Example

The first modified example provides a heat radiator 20 shown in FIG. 9A in which 'rectangular' through holes 22 (or 26) whose horizontal shape is rectangular are uniformly dispersed over the surface of a tungsten-rich base substrate 21 composed of Cu—W (or a tungsten board 25). The through holes 22 (or 26) are filled with copper-rich filler materials 23 composed of Cu—W (or copper materials 27) by infiltration. The horizontal shape of the through holes 22 (or 26) is not necessarily limited to the rectangular shape; hence, it is possible to employ other shapes such as elliptical shapes, triangular shapes, and polygonal shapes in accordance with the use of the heat radiators.

(2) Second Modified Example

The second modified example provides a heat radiator 30 shown in FIG. 9B in which 'circular' through holes 32 (or 36) whose horizontal shape is circular are irregularly dispersed over the surface of a tungsten-rich base substrate 31 composed of Cu—W (or a tungsten board 35). The through holes 32 (or 36) are filled with copper-rich filler materials 33 composed of Cu—W (or copper materials 37) by infiltration. The horizontal shape of the through holes 32 (or 36) is not necessarily limited to the circular shape; hence, it is possible to employ other shapes such as elliptical shapes, rectangular shapes, and polygonal shapes in accordance with the use of the heat radiators.

(3) Third Modified Example

The third modified example provides a heat radiator shown in FIG. 9C in which 'linear' through holes or channels 42 (or 46) are formed in a radial manner extending from the center to the periphery over the surface of a tungsten-rich base substrate 41 composed of Cu—W (or a tungsten board 45). Such linear through holes 42 (or 46) radially formed over the surface are filled with copper-rich filler materials 43 composed of Cu—W (or copper materials 47) by infiltration.

6. Application for Heat Radiators

Figure 10:
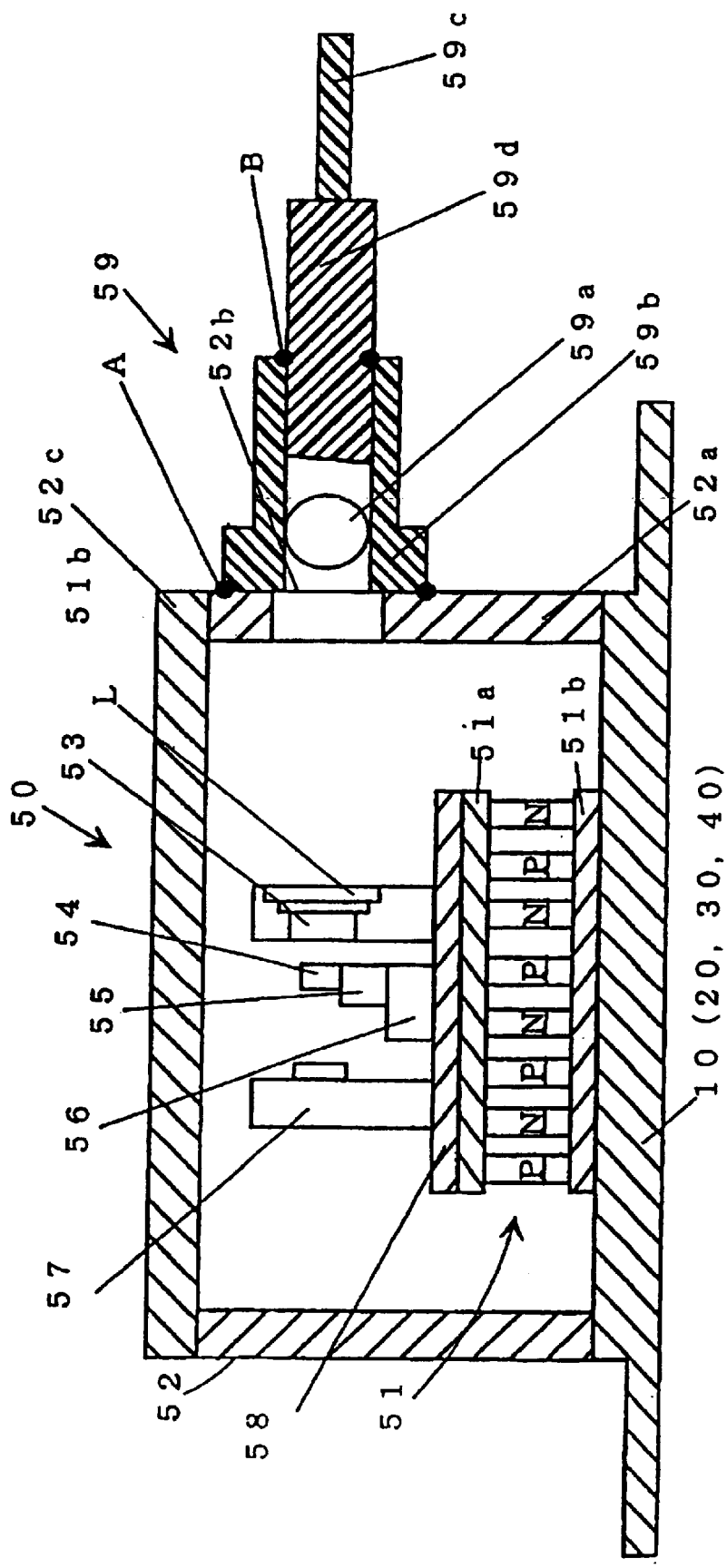
FIG. 10 is a sectional view showing an internal mechanism and structure of a semiconductor laser module employing heat radiators that are manufactured in accordance with the invention.

Next, an example of application for the heat radiator(s) will be described with reference to FIG. 10, which shows an internal mechanism or structure of a semiconductor laser module using heat radiators of this invention. The semiconductor laser module is constructed by integrally storing semiconductor laser elements and a lens in a package, which is connected to an optical fiber to configure an optical amplifier.

In the semiconductor laser module, it is required that the semiconductor laser element, which is used as a source of generating laser beams, provides a very high power output. That is, it requires drive currents ranging about several hundreds of milli-amperes. Therefore, the semiconductor laser element produces a large heating value, which may cause reduction of its optical output or reduction of its life. In addition, the semiconductor laser element is easily influenced by variations in atmospheric temperature, so that its optical characteristics are easily changed; for example, the laser beam may be easily varied in wavelength. In order to compensate for variations in optical characteristics of the semiconductor laser element, a thermoelectric module using Peltier elements is installed in the body of the semiconductor laser module, so that it provides spot cooling of the semiconductor laser element.

Next, a description will be given with respect to the internal structure of a semiconductor laser module 50 with reference to FIG. 10. Components of the semiconductor laser module 50 are stored in a metal package body (or a frame body) 52 in which a light output window 52b is formed at a prescribed position of a side wall 52a. In addition, a heat radiator 10 (or heat radiators 20, 30, 40) are firmly attached to a lower portion of the frame body 52 by brazing. Further, a sealing cover 52c is attached to a prescribed position of an upper portion of the frame body 52. The frame body 52 stores a thermoelectric module 51, which is composed of a plurality of Peltier elements arranged linearly between a pair of substrates 51a and 51b by intervention of electrodes (not specifically shown), wherein each Peltier element consists of a pair of a p-type thermoelectric element and an n-type thermoelectric element. In the thermoelectric module 51, the p-type thermoelectric elements and n-type thermoelectric elements are alternately arranged in the order P, N, P, and N, and they are electrically connected in series by conduction. In addition, leads are respectively connected to the electrodes that are joined together with the leftmost p-type thermoelectric element and the rightmost n-type thermoelectric element respectively.

A semiconductor laser element 54, a lens L, a light receiving element 57, and other parts are mounted on a base board 58, which is fixed to the upper surface of the substrate 51a. In addition, the substrate 51b is fixed onto the heat radiator 10 (or heat radiators 20, 30, 40) in such a way that the lower surface of the substrate 51b is joined together with the upper surface of the heat radiator 10 (or upper surfaces of the heat radiators 20, 30, 40). The base board 58 is joined and fixed to the substrate 51a. The semiconductor laser element 54 is installed in a heatsink 55, which performs heat dissipation of the semiconductor laser element 54. The heatsink 55 is made of the prescribed materials (e.g., diamond, SiC, silicon, Cu—W infiltrated material, Cu—W—Ni alloy, etc.) that have approximately the same thermal expansion coefficient of the semiconductor laser element 54. Thus, it is possible to avoid occurrence of problems due to the thermal stress, which may occur between the semiconductor laser element 54 and the heatsink 55. Incidentally, it is possible to use the heat radiator of this invention instead of the heatsink 55.

The heatsink 55 is installed in a header 56, which has terminals for electrodes of the semiconductor laser element 54. At the rear side of the header 56, there is provided a light receiving element 57, which is used to monitor variations in optical output of the semiconductor laser element 54 due to variations in the temperature. In response to an output of the light receiving element 57, a feedback effect is performed on a drive circuit (not shown) so as to normally maintain the optical output of the semiconductor laser element 54 constant. The lens L is fixed in position by a lens holder 53.

The lens holder 53 holds the lens L to adjust its optical axis in such a way that laser beams output from the semiconductor laser element 54, which may be broadened or dispersed in the space, are certainly converted to parallel beams by the lens L. Then, the lens holder 53 holding the lens L is fixed to the base board 58 by the YAG laser (namely, a neodymium-doped yttrium-aluminum garnet laser). That is, the YAG laser welding having a high fixing stability is used to meet the strict requirement that the sensitivity for axial deviations between the semiconductor laser element 54 and lens L after adjustment of its optical axis should be 1 $\mu$m or less. Thus, laser beams output from the semiconductor laser element 54 are certainly converted to parallel beams by the lens L, so that the parallel beams are transmitted through the light output window 52b.

A sleeve 59b is arranged at the front side of the package 52 containing the lens A, wherein a lens 59a is fixed to the sleeve 59b by means of a ferrule 59d. The lenses L and 59a are adjusted in optical axes thereof in such a way that laser beams output from the semiconductor laser element 54 are transmitted through the light output window 52b and are efficiently incident on a terminal portion of an optical fiber 59c by way of the lens 59a. Then, the sleeve 59b are fixed to the side wall 52a at prescribed end portions A and B thereof by the laser welding using the YAG laser. Therefore, laser beams output from the semiconductor laser element 54 are efficiently introduced into the optical fiber 59c by way of the lenses L and 59a. The aforementioned semiconductor laser module 50 can provide a very high output because the thermoelectric module 51 containing the Peltier elements normally cools the semiconductor laser element 54, which is noticeably reduced in heating value. In addition, heat generated by the high-temperature sides of the thermoelectric module 51 (i.e., heating sides of the Peltier elements) are efficiently radiated to the outside by means of the heat radiator 10 (or heat radiators 20, 30, 40).

As described before, this invention provides the heat radiator 10 (or heat radiators 20, 30, 40), which is produced by using the substrate 11 (or 15, 21, 31, 41) made of the prescribed material of the low thermal expansion coefficient, wherein through holes 12 (or 16, 22, 26, 32, 36, 42, 46) are formed over the surface of the substrate and are filled with the prescribed material 13 (or 23, 33, 43) of the high thermal conductivity or the copper material 17 (or 27, 37, 47) by infiltration. Herein, the thermal conduction is established along the prescribed portions which correspond to the material 13 of the high thermal conductivity or the copper material 17.

As described above, directions of the thermal conduction match axial directions of the through holes 12 (or 16, 22, 26, 32, 36, 42, 46), whereas the thermal expansion is reduced by the substrate 11 (or 15, 21, 31, 41) of the low thermal expansion coefficient. In short, the heat radiator of this invention can rapidly dissipate heat generated by the electronic device from its circuit board or casing. In addition, it is possible to reduce the thermal expansion of the heat radiator itself.

The application of the heat radiator of this invention is not necessarily limited to the semiconductor laser module, which has been described with reference to FIG. 10. That is, the heat radiators of this invention can be applied to a variety of electronic devices such as LSI devices, VLSI devices, and diodes.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalents of such metes and bounds are therefore intended to be embraced by the claims.

What is claimed is:

1. A heat radiator for removing heat from an electronic device, comprising:
   a substrate made of a first material that is selected from among a copper-tungsten alloy whose copper content is lower than a tungsten content, and a copper-molybdenum alloy whose copper content is lower than a molybdenum content;
   a plurality of through holes that are arranged over a surface of the substrate; and
   a second material that is selected from among a copper-tungsten alloy whose copper content is higher than a tungsten content, and a copper-molybdenum alloy whose copper content is higher than a molybdenum content, wherein the second material is filled into the plurality of through holes of the substrate, thus allowing thermal conduction along axial directions of the through holes.

2. The heat radiator for removing heat from an electronic device according to claim 1, wherein the through holes are subjected to a unidirectional multicentral arrangement or a unidirectional radial arrangement.

3. The heat radiator for removing heat from an electronic device according to claim 1, wherein a total volume ratio of the through holes occupied against an overall volume of the substrate is approximately 10 vol. % or more and/or 45 vol. % or less.

4. The heat radiator for removing heat from an electronic device according to claim 3, wherein an average diameter of the through holes is approximately 50 $\mu$m or more and/or 1 mm or less.

5. The heat radiator for removing heat from an electronic device according to claim 1, wherein an average diameter of the through holes is approximately 50 $\mu$m ore more and/or 1 mm or less.

6. The heat radiator for removing heat from an electronic device according to claim 1, wherein each of the through holes has one of a circular shape and a rectangular shape.

7. The heat radiator for removing heat from an electronic device according to claim 1, wherein the through holes are formed as channels that linearly extend in a radial manner over the surface of the substrate.

8. A heat radiator for removing heat from an electronic device, comprising:
   a substrate made of a first material that is selected from among metals and alloys whose linear thermal coefficients under a condition where temperature is increased from room temperature to 400° C. is approximately 10 ppm/K or less;
   a plurality of through holes that are arranged over a surface of the substrate; and
   a second material that is made of copper and is infiltrated into the plurality of through holes of the substrate, thus allowing thermal conduction along axial directions of the through holes.

9. The heat radiator for removing heat from an electronic device according to claim 8, wherein the first material is selected from among tungsten, iron-nickel alloy, and iron-nickel-cobalt alloy.

10. The heat radiator for removing heat from an electronic device according to claim 8, wherein each of the through holes has one of a circular shape and a rectangular shape.

11. The heat radiator for removing heat from an electronic device according to claim 8, wherein the through holes are formed as channels that linearly extend in a radial manner over the surface of the substrate.

12. A semiconductor laser module comprising:
   a semiconductor laser element for emitting laser beams, which is mounted on a board;
   a thermoelectric module containing a plurality of thermoelectric elements which are electrically connected by conduction, wherein the thermoelectric module is arranged between a pair of electrodes formed at surfaces of insulating substrates which are arranged opposite to each other, wherein a heat absorption side of the thermoelectric module is attached to the board for mounting the semiconductor laser element; and
   a heat radiator composed of a substrate having a plurality of through holes attached to a heat radiation side of the thermoelectric module,
   wherein the substrate is made of a first material having a first thermal expansion coefficient and a first thermal conductivity, and the through holes are respectively filled with a second material having a second thermal expansion coefficient and a second thermal conductivity, the first thermal expansion coefficient being lower than the second thermal expansion coefficient, and the second thermal conductivity being higher than the first thermal conductivity.

13. The semiconductor laser module according to claim 12, wherein the through holes each having one of a circular shape and a rectangular shape are arranged over a surface of the substrate in such a way that a total volume ratio of the through holes occupied against an overall volume of the substrate is approximately 10 vol. % or more and/or 45 vol. % or less.

14. The semiconductor laser module according to claim 12, wherein an average diameter of the through holes is approximately 50 µm or more and/or 1 mm or less.

15. The semiconductor laser module according to claim 12, wherein the first material is composed of a copper-tungsten alloy or a copper-molybdenum alloy in which a copper content is smaller than a tungsten content or a molybdenum content, while the second material is composed of a copper-tungsten alloy or a copper-molybdenum alloy in which a copper content is greater than a tungsten content or a molybdenum content.

16. The semiconductor laser module according to claim 12, wherein the first material whose thermal expansion coefficient is approximately 10 ppm/K or less is composed of tungsten, iron-nickel alloy, or iron-nickel-cobalt alloy, while the second material is composed of copper.

* * * * *